US012755077B2

(12) United States Patent
Hsu et al.

(10) Patent No.: US 12,755,077 B2
(45) Date of Patent: Oct. 6, 2026

(54) COMPILING A TENSOR TILING SPECIFICATION TO MULTI-DIMENSIONAL DATA MOVER CIRCUIT CONFIGURATIONS

(71) Applicant: Xilinx, Inc., San Jose, CA (US)

(72) Inventors: Chia-Jui Hsu, Santa Clara, CA (US); Fnu Sindhoori, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 671 days.

(21) Appl. No.: 18/345,393

(22) Filed: Jun. 30, 2023

(65) Prior Publication Data

US 2025/0005246 A1 Jan. 2, 2025

(51) Int. Cl.

| | |
|---|---|
| ***G06F 30/337*** | (2020.01) |
| ***G06F 16/22*** | (2019.01) |
| ***G06F 30/27*** | (2020.01) |
| ***G06F 30/327*** | (2020.01) |
| ***G06F 30/331*** | (2020.01) |
| ***G06F 30/34*** | (2020.01) |

(Continued)

(52) U.S. Cl.
CPC ........ *G06F 30/337* (2020.01); *G06F 16/2264* (2019.01); *G06F 30/27* (2020.01); *G06F 30/327* (2020.01); *G06F 30/331* (2020.01); *G06F 30/34* (2020.01); *G06N 3/04* (2013.01); *G06N 3/047* (2023.01)

(58) Field of Classification Search
CPC ........ G06F 30/337; G06F 30/34; G06F 30/27; G06F 30/327; G06F 30/331; G06F 16/2264; G06N 3/04; G06N 3/047
USPC .............. 716/122, 117, 105; 703/16, 17, 20; 706/25, 33, 44
See application file for complete search history.

(56) References Cited

U.S. PATENT DOCUMENTS 10,310,768 B1 * 6/2019 Gauria ................. G06N 3/0464
10,387,298 B2 * 8/2019 Baum ................. G06F 12/0207
10,802,807 B1 10/2020 Hsu
(Continued)

FOREIGN PATENT DOCUMENTS

GB 2586297 A * 2/2021 ............... G06T 1/60
WO WO-2022266984 A1 * 12/2022 ......... G06F 12/0871

OTHER PUBLICATIONS

US 11,296,707 B1, 04/2022, Rodriguez (withdrawn)
(Continued)

*Primary Examiner* — Phallaka Kik
(74) *Attorney, Agent, or Firm* — Kevin T. Cuenot

(57) ABSTRACT

Compiling a tensor specification for multi-dimensional direct memory access circuit configurations includes generating a first list of tile combination objects from a tensor tiling specification. The first list specifies a sequence of tiles specified by the tensor tiling specification in which each tile object represents a single tile of a tensor data structure. A second list of tile combination objects is generated by combining selected ones of the tile combination objects from the first list. Each tile combination object of the second list represents one or more tile objects. The tile combination objects of the second list are converted into buffer descriptor objects that include buffer descriptor parameters. Each of the buffer descriptor objects that is non-compliant with hardware constraints corresponding to a data mover circuit that is configurable using the buffer descriptor objects is legalized. The buffer descriptor objects are output, as legalized.

20 Claims, 14 Drawing Sheets

(51) Int. Cl.
*G06N 3/04* (2023.01)
*G06N 3/047* (2023.01)

(56) References Cited

U.S. PATENT DOCUMENTS

| | | | | |
|---|---|---|---|---|
| 10,990,552 | B1 | 4/2021 | Bilski | |
| 11,126,574 | B1 | 9/2021 | Prabhakar | |
| 11,281,440 | B1 | 3/2022 | Hsu | |
| 11,327,677 | B1 * | 5/2022 | Denolf | G06F 3/0659 |
| 11,336,287 | B1 | 5/2022 | Rodriguez | |
| 11,687,615 | B2 * | 6/2023 | Zhang | G06F 17/16 708/204 |
| 12,159,057 | B2 | 12/2024 | Hsu et al. | |
| 2007/0050603 | A1 | 3/2007 | Vorbach | |
| 2019/0303311 | A1 | 10/2019 | Bilski | |
| 2019/0370592 | A1 * | 12/2019 | Kojima | G06T 7/11 |
| 2020/0334889 | A1 * | 10/2020 | Rollingson | G06T 11/40 |
| 2020/0371759 | A1 | 11/2020 | Sastry | |
| 2020/0372200 | A1 | 11/2020 | Sivaraman | |
| 2021/0248806 | A1 * | 8/2021 | Yang | G06T 1/20 |
| 2021/0256699 | A1 * | 8/2021 | Wainrib | G06T 7/194 |
| 2021/0271847 | A1 * | 9/2021 | Courtiol | G06V 10/764 |
| 2021/0373867 | A1 | 12/2021 | Chen | |
| 2022/0058005 | A1 | 2/2022 | Gupta | |
| 2022/0188638 | A1 | 6/2022 | Mathaikutty | |
| 2022/0198230 | A1 * | 6/2022 | Chen | G06F 18/2415 |
| 2022/0309316 | A1 * | 9/2022 | Nama | G06N 3/0464 |
| 2022/0309323 | A1 * | 9/2022 | Nama | G06N 3/04 |
| 2022/0410381 | A1 * | 12/2022 | Stoppi | G06T 7/50 |
| 2023/0325312 | A1 | 10/2023 | Koeplinger | |
| 2024/0135514 | A1 * | 4/2024 | Pakhomov | G06T 7/11 |
| 2024/0220269 | A1 | 7/2024 | Eyole | |
| 2024/0256475 | A1 * | 8/2024 | Chen | G06F 13/28 |
| 2025/0363700 | A1 * | 11/2025 | Wang | G06V 20/40 |

OTHER PUBLICATIONS

Hu et al., "Generalized Tensor Decomposition With Features on Multiple Modes", Journal of Computational and Graphical Statistics, Oct. 25, 2021, 34 pages. (Year: 2021).*

Maei, "Tile-Coding: An Efficient Sparse-Coding Method for Real-Valued Data", Criteo Tech Blog, Jul. 22, 2019, 14 pages. (Year: 2019).*

Gao, Mingyu, and Christos Kozyrakis. "HRL: Efficient and flexible reconfigurable logic for near-data processing." 2016 IEEE International Symposium on High Performance Computer Architecture (HPCA). Ieee, 2016. (Year: 2016).

Thomas M. Parks, et al., "A Comparison of Synchronous and Cyclo-Static Dataflow", Presented at the Asilomar Conference on Signals, Systems and Computers—Oct. 1995, 7 pages.

Boulos, V. et al., "Efficient implementation of data flow graphs on multi-gpu clusters," Journal of Real-Time image Processing, vol. 9, 2014, pp. 217-232.

Parks, T. M. et al., "A Comparison of Synchronous and Cyclo-Static Dataflow," Presented at the Asilomar Conf. on Signals, Systems and Computers—Oct. 1995, 7 pg.

* cited by examiner

| Dimension | Step-size | Wrap | Pad-Before | Pad-After |
|---|---|---|---|---|
| 0 | 1 | 5 | 3 | 0 |
| 1 | 64 | 4 | 2 | 0 |
| Buffer-Lengh: | 48 | | | |

```
    /// Traversing parameters.
struct traversing_parameters
{
    /// The dimension of the inter-tile traversing loop.
uint32_t dimension;
    /// stride represents the distance in terms of buffer element type between
consecutive inter-tile traversal in the dimension
uint32_t stride;
    /// wrap represents the number of steps before wrapping the current traversing
loop and incrementing to the next traversing loop.
    /// The traversal stops when the last wrap completes.
uint32_t wrap;
};

    /// Tiling parameters.
struct tiling_parameters
{
    /// Buffer dimensions in buffer element type. buffer_dimension[0] is the fast-
moving dimension and is contiguous in memory.
    /// When this variable is left unspecified, the dimensions of the associated buffer
object will be used.
std::vector<uint32_t> buffer_dimension;
    /// Tiling dimensions in buffer element type.
std::vector<uint32_t> tiling_dimension;
    /// Multi-dimensional offset w.r.t. buffer starting element. Assuming buffer
dimension is specified.
std::vector<int32_t> offset;
    /// Vector of traversing_parameters. tile_traversal[i] represents i-th loop of inter-
tile traversal, where i=0 represents most inner loop and i=N-1 represents most
outer loop.
std::vector<traversing_parameters> tile_traversal;
    /// Output port id of the connected pktsplit or the input port id of the connected
pktmerge.
int packet_port_id = -1;
    /// Number of repetitions of tiling traversal
uint32_t repetition = 1;
    /// Real data boundary dimension for padding
std::vector<uint32_t> boundary_dimension;
};
```

FIG. 6A

```
struct buffer_descriptor_parameters
{
  /// Transaction length in 32bit word
  uint32_t length = 0;
  /// Offset in 32bit word w.r.t. buffer starting address
  uint32_t offset = 0;
  /// D0, D1, D2, D3(memory tile only) stepsize in 32-bit word
  std::vector<uint32_t> stepsize;
  /// D0, D1, D2(memory tile only)
  std::vector<uint32_t> wrap;
  /// D0, D1, D2 zero-before and zero-after in 32-bit word. MM2S only.
  std::vector<std::pair<uint32_t, uint32_t>> padding;
  /// Output port id of the connected pktsplit or the input port id of the connected
pktmerge
  uint32_t iteration_stepsize = 0;
  /// Iteration wrap
  uint32_t iteration_wrap = 0;
  /// Iteration current
  uint32_t iteration_current = 0;
};
```

FIG. 6B

```
struct tile_combination
{
  /// real data tile dimension without zero padding area
  std::vector<uint32_t> tiling_dimension;
  /// real data tile offset without zero padding area
  std::vector<int32_t> offset;
  /// {{D0_before, D0_after}, {D1_before, D1_after}, {D2_before, D2_after}, ...}
  std::vector<std::pair<uint32_t, uint32_t>> padding;
  /// empty vector for single tile. Use tile_traversal to combine multiple tiles
  std::vector<adf::traversing_parameters> tile_traversal;
};
```

FIG. 7

```
Declare variable currentBdStepsize and currentBdWrap
Declare variable combineBdDim = false

For each intra-tile dimension j from 0 to N-1 // where N is tc.tiling_dimension.size()
    If previous intra-tile dimension uses a buffer descriptor dimension (combineBdDim ==
    false), set
        currentBdStepsize = tp.buffer_dimension[0] * … * tp.buffer_dimension[j]
        currentBdWrap = tc.tiling_dimension[j]
    else if previous intra-tile dimension is going to combine with this tile dimension
    (combineBdDim == true), set
        currentBdWrap = currentBdWrap * tc.tiling_dimension[j]

    Determine whether the current tile dimension j can be combined with the next tile
    dimension or the first tile traversal dimension. This operation saves the use of buffer
    descriptor dimension as it is limited on hardware. The current tile dimension j can be
    combined if one of the following two conditions apply:

        i. If current intra-tile dimension j < N-1, AND tc.tiling_dimension[j] ==
           to.buffer_dimension[j], AND there is no padding in tc.padding at dimension
           j; or
        ii. If current intra-tile dimension j == N-1, AND tc.tile_traversal is not empty,
           AND j == tc.tile_traversal[0].dimension, AND tc.iling_dimension[j]
           ==tc.tile_traversal[0].stride and there is no padding in tc.padding at
           dimension j

    If the current intra-tile dimension j can be combined, set    combineBdDim = true,
    otherwise set combineBdDim = false.
```

FIG. 11A

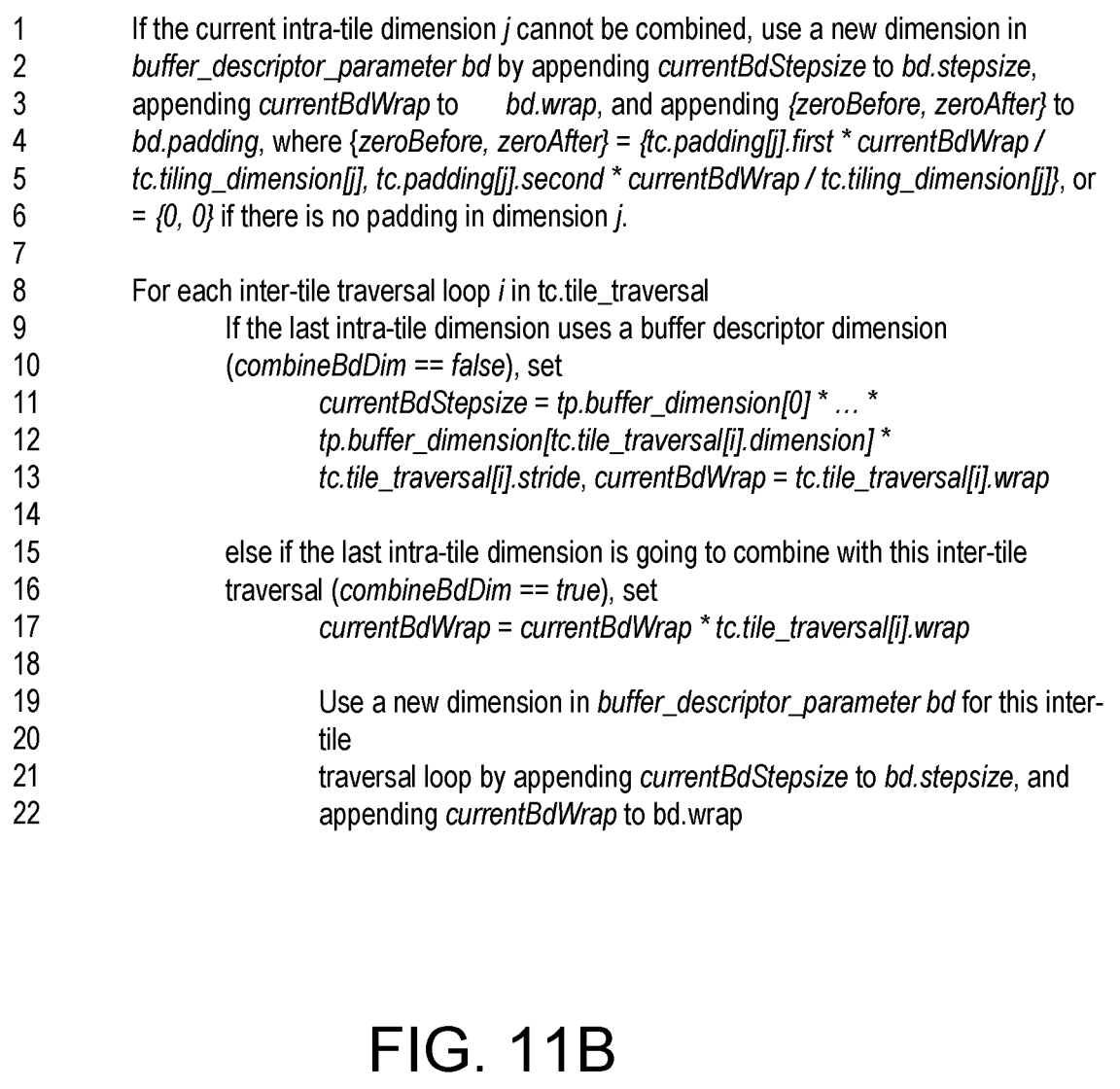

```
If the current intra-tile dimension j cannot be combined, use a new dimension in
buffer_descriptor_parameter bd by appending currentBdStepsize to bd.stepsize,
appending currentBdWrap to      bd.wrap, and appending {zeroBefore, zeroAfter} to
bd.padding, where {zeroBefore, zeroAfter} = {tc.padding[j].first * currentBdWrap /
tc.tiling_dimension[j], tc.padding[j].second * currentBdWrap / tc.tiling_dimension[j]}, or
= {0, 0} if there is no padding in dimension j.

For each inter-tile traversal loop i in tc.tile_traversal
        If the last intra-tile dimension uses a buffer descriptor dimension
        (combineBdDim == false), set
                currentBdStepsize = tp.buffer_dimension[0] * ... *
                tp.buffer_dimension[tc.tile_traversal[i].dimension] *
                tc.tile_traversal[i].stride, currentBdWrap = tc.tile_traversal[i].wrap

        else if the last intra-tile dimension is going to combine with this inter-tile
        traversal (combineBdDim == true), set
                currentBdWrap = currentBdWrap * tc.tile_traversal[i].wrap

                Use a new dimension in buffer_descriptor_parameter bd for this inter-
                tile
                traversal loop by appending currentBdStepsize to bd.stepsize, and
                appending currentBdWrap to bd.wrap
```

FIG. 11B

COMPILING A TENSOR TILING SPECIFICATION TO MULTI-DIMENSIONAL DATA MOVER CIRCUIT CONFIGURATIONS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to moving tensor data within an IC through compilation of a tensor tiling specification into configuration data for data mover circuits.

BACKGROUND

Some varieties of integrated circuits provide architectures that include multiple compute circuits that operate concurrently and in cooperation with one another. Such ICs are capable of providing significant computational power and a high degree of parallelism. An application intended to execute on a multi-compute circuit architecture often consumes significant amounts of data. The ability to efficiently provide data to the compute circuits and output resulting data from the compute circuits has a significant effect on runtime performance of the application as executed on the target hardware.

One type of application that may be executed on a multi-compute circuit architecture is a machine learning application that relies on and/or leverages a neural network. Such an application often models data using multi-dimensional tensors. As the size of the multi-dimensional tensors may exceed the memory capacity of the multi-compute circuit architecture, tensor tiling decisions are made that partition the tensors. The tensor tiling decisions, which may be specified at a high-level of abstraction, may partition each tensor into a plurality of sub-volumes that are distributed across a memory hierarchy of the multi-compute circuit architecture to support parallel operation of the various compute circuits therein. The tensor tiling decisions may also specify how sub-volumes that are output from the multi-compute circuit architecture are gathered and prepared for implementing the next layer of processing.

Typically, data is moved into and out from the multi-compute circuit architecture using one or more data mover circuits. An example of a data mover circuit is a direct memory access (DMA) circuit. The data mover circuits may be loaded with low-level configuration data that defines the data transfers to be performed. Presently, there is no direct technique for generating the low-level configuration data necessary to configure the data mover circuits from the high-level tensor tiling decisions.

Brute force approaches result in a large quantity of configuration data for the data mover circuits. The data mover circuits, however, have limited configuration resources (e.g., storage space for the low-level configuration data). As such, brute force approaches often result in infeasible solutions where the size of the configuration data exceeds the configuration resources and/or capacity of the data mover circuits. To utilize a brute force solution, an external controller is often needed to control the multi-compute circuit architecture in order to consistently and/or continually recycle buffer descriptors to enqueue tasks to the data mover circuits. This approach introduces significant runtime overhead to the multi-compute circuit architecture.

SUMMARY

In one or more example implementations, a method includes generating a first list of tile combination objects from a tensor tiling specification. Each tile combination object of the first list represents a single tile of a tensor data structure. The method includes generating a second list of tile combination objects by combining selected ones of the tile combination objects from the first list. Each tile combination object of the second list represents one or more tiles. The method includes converting the tile combination objects of the second list into buffer descriptor objects including buffer descriptor parameters. The method includes legalizing each of the buffer descriptor objects that is non-compliant with hardware constraints corresponding to a data mover circuit configurable using the buffer descriptor objects. The method includes outputting the buffer descriptor objects, as legalized.

The foregoing and other implementations can each optionally include one or more of the following features, alone or in combination. Some example implementations include all the following features in combination.

In some aspects, the tensor tiling specification specifies a data access pattern, implemented by a user design, for the tensor data structure.

In some aspects, the user design is executable by a multi-circuit hardware architecture.

In some aspects, the multi-circuit hardware architecture includes a data processing array having a plurality of data processing array tiles.

In some aspects, the generating the first list of the tile combination objects includes determining tiles of the tensor data structure from the tensor tiling specification.

In some aspects, the method includes traversing the tensor tiling specification to determine a traversal order of the tiles of the tensor data structure for the user design. The first list is specified in the traversal order.

In some aspects, the legalizing includes splitting at least one of the buffer descriptor objects into a plurality of buffer descriptor objects based on hardware constraints.

In one or more example implementations, a system includes one or more hardware processors configured (e.g., programmed) to initiate and/or execute operations as described within this disclosure.

In one or more example implementations, a computer program product includes one or more computer readable storage mediums having program instructions embodied therewith. The program instructions are executable by computer hardware, e.g., a hardware processor, to cause the computer hardware to initiate and/or execute operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 6A illustrates example tile traversing parameters and example tiling parameters.

FIG. 6B illustrates an example buffer descriptor generated in accordance with the inventive arrangements described herein.

FIG. 7 illustrates an example of a tile combination struct object that may be used to represent either a single tile or a plurality of tiles of a tensor data structure.

FIGS. 11A and 11B, taken collectively, illustrate an example pseudo code implementation of block 510 of FIG. 5.

DETAILED DESCRIPTION

Figure 1:
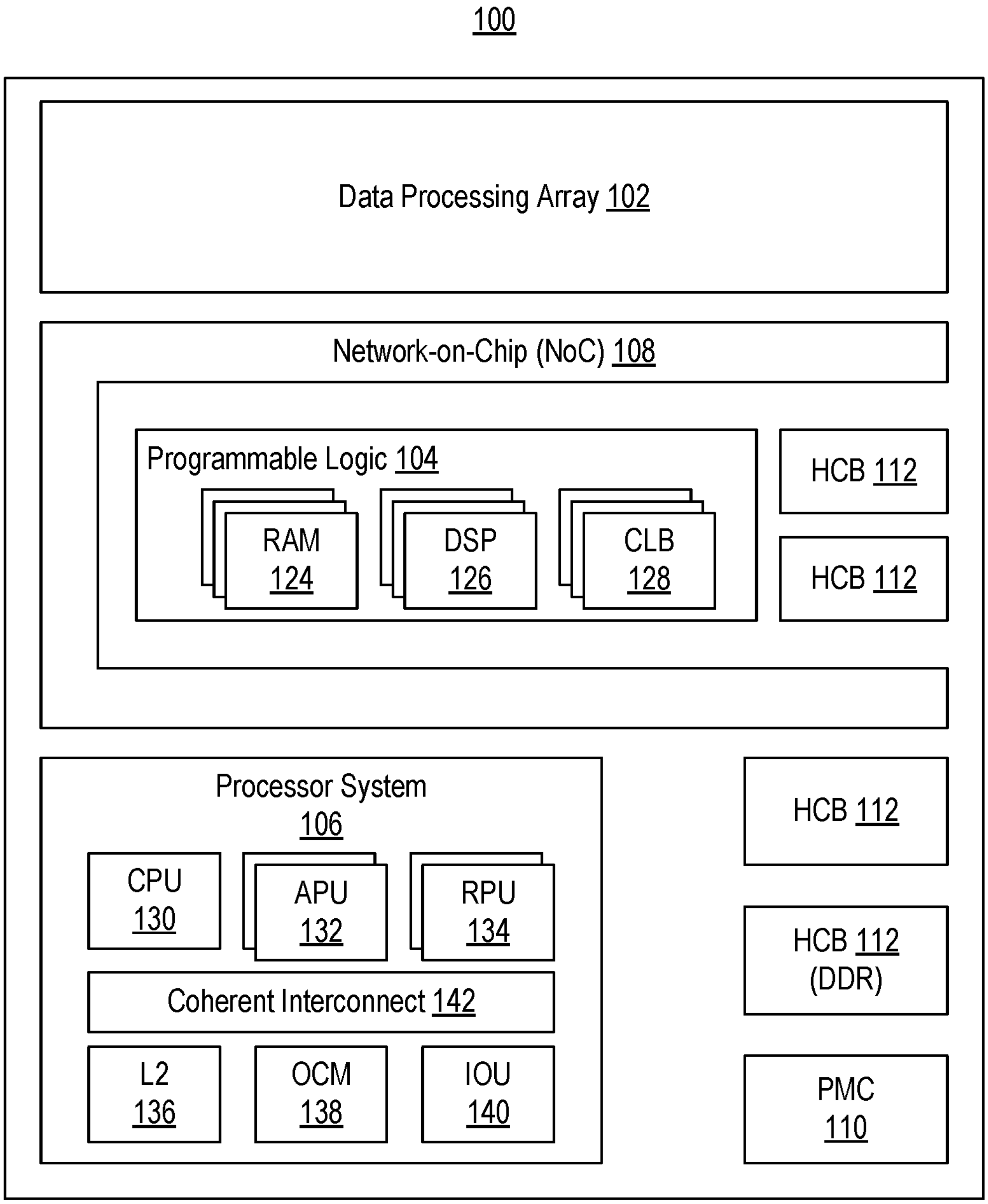
FIG. 1 illustrates an example architecture for an integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to moving tensor data within an IC through compilation of a tensor tiling specification into configuration data for data mover circuits. Within this disclosure, configuration data for data mover circuits refers to register configurations, e.g., data to be loaded into hardware configuration registers, that controls operation of the data mover circuits. In accordance with the inventive arrangements described within this disclosure, a tensor tiling specification for a user design intended to execute on a multi-compute tile architecture may be provided. The user design may be one that performs machine learning (e.g., uses a neural network and/or performs inference), video processing, or other application involving the use of multi-dimensional data.

The tensor tiling specification may be specified at a high-level of abstraction. The tensor tiling specification allows a designer to specify particular sub-volumes of a tensor, referred to herein as "tiles," and traversal of the tiles to access the tensor. The subdivision of the tensor into tiles and the order in which the tiles are traversed during execution of the user design is referred to herein as a "data access pattern." The tensor tiling specification, being high-level in nature, is untethered from the practical considerations of the underlying hardware that requires configuration to implement the data access patterns.

The tensor tiling specification may be compiled into configuration data for the hardware that will implement the data access patterns for the multi-compute circuit architecture. In one or more example implementations, the underlying hardware includes one or more data mover circuits. An example of a data mover circuit is a direct memory access (DMA) circuit. Each DMA circuit is subject to particular hardware constraints. For example, each DMA circuit has limited configuration resources such as the number of buffer descriptor registers available for storing buffer descriptors. A buffer descriptor is a low-level description or instruction for the DMA circuit or for a channel of the DMA circuit, to perform a particular data transfer as part of the larger data access pattern to be implemented for the user design. Buffer descriptors are stored in buffer descriptor registers on a one-to-one basis and are examples of configuration data for data mover circuits. As the number of buffer descriptor registers of each DMA circuit is limited, the tensor tiling specification must be converted into a number of buffer descriptors that fits within the available buffer descriptor registers of the data mover circuits. Another hardware constraint relates to the fields in each buffer descriptor register. Each field may be limited to a particular size or number of bits. The buffer descriptor must conform to these hardware constraints.

The inventive arrangements provide methods, systems, and computer program products for generating a tensor tiling specification and compiling the tensor tiling specification into configuration data for data mover circuit(s). As noted, the tensor tiling specification defines a data access pattern for a tensor. The tensor tiling specification may be compiled into buffer descriptors that may be loaded into the data mover circuits (e.g., DMA circuits). The DMA circuits, as configured with the buffer descriptors, may implement the data access pattern specified by the tensor tiling specification during execution of the user design within and/or by the multi-compute circuit architecture. The inventive arrangements are operative to minimize the number of buffer descriptors that are generated and ensure that the buffer descriptors that are generated conform to the hardware constraints of the data mover circuits.

While the inventive arrangements are described using a multi-dimensional DMA circuit implementation, the inventive arrangements may be used with other types of multi-dimensional data movers. The compilation techniques described within this disclosure may be used to implement multi-dimensional data partitioning and a data access pattern that facilitates parallel processing of the tensor.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example architecture 100 for an IC. Architecture 100 may be used to implement a variety of different types of ICs including, but not limited to, a programmable IC, an adaptive system, and/or a System-on-Chip (SoC). In the example of FIG. 1, architecture 100 is implemented on a single die provided within a single package. In other examples, architecture 100 may be implemented using a plurality of interconnected dies within a single package where the various resources of architecture 100 (e.g., circuits) illustrated in FIG. 1 are implemented across the different interconnected dies.

In the example, architecture 100 includes a plurality of different subsystems including a data processing (DP) array 102, programmable logic (PL) 104, a processor system (PS) 106, a Network-on-Chip (NoC) 108, a platform management controller (PMC) 110, and one or more hardwired circuit blocks (HCBs) 112.

DP array 102 is implemented as a plurality of interconnected and programmable circuit blocks also referred to herein as tiles. Appreciably, the tiles of DP array 102, being circuit blocks, are to be distinguished from tiles of a tensor. DP array 102 is described in greater detail herein in connection with FIG. 2.

PL 104 is circuitry that may be programmed to perform specified functions. As an example, PL 104 may be implemented as field programmable gate array type of circuitry. PL 104 can include an array of programmable circuit blocks. The programmable circuit blocks may include, but are not limited to, RAMs 124 (e.g., block RAMs of varying size), digital signal processing (DSP) blocks 126 capable of performing various multiplication operations, and/or configurable logic blocks (CLBs) 128 each including one or more flip-flops and a lookup table. As defined herein, the term "programmable logic" means circuitry used to build reconfigurable digital circuits. The topology of PL 104 is highly configurable unlike hardwired circuitry. Connectivity among the circuit blocks of PL 104 may be specified on a per-bit basis while the circuit blocks of DP array 102 are connected by multi-bit data paths (e.g., streams) capable of packet-based and/or circuit-switched communication.

PS 106 is implemented as hardwired circuitry that is fabricated as part of architecture 100. PS 106 may be implemented as, or include, any of a variety of different processor types each capable of executing program code. For example, PS 106 may include a central processing unit (CPU) 130, one or more application processing units (APUs) 132, one or more real-time processing units (RPUs) 134, a level 2 (L2) cache 136, an on-chip memory (OCM) 138, and an Input/Output Unit (IOU) 140, each interconnected by a coherent interconnect 142. The example CPU and/or processing units of PS 106 may be implemented using any of a variety of different types of architectures. Example architectures that may be used to implement processing units of PS 106 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 108 is a programmable interconnecting network for sharing data between endpoint circuits in architecture 100. NoC 108 may be implemented as a packet-switched network. The endpoint circuits can be disposed in DP array 102, PL 104, PS 106, and/or selected HCBs 112. NoC 108 can include high-speed data paths with dedicated switching. In an example, NoC 108 includes one or more horizontal paths, one or more vertical paths, or both horizontal and vertical paths. NoC 108 is an example of the common infrastructure that is available within architecture 100 to connect selected components and/or subsystems.

Being programmable, nets that are to be routed through NoC 108 may be unknown until a design is created and routed for implementation within architecture 100. NoC 108 may be programmed by loading configuration data into internal configuration registers that define how elements within NoC 108 such as switches and interfaces are configured and operate to pass data from switch to switch and among the NoC interfaces to connect the endpoint circuits. NoC 108 is fabricated as part of architecture 100 (e.g., is hardwired) and, while not physically modifiable, may be programmed to establish logical connectivity between different master circuits and different slave circuits of a user circuit design.

PMC 110 is a subsystem within architecture 100 that is capable of managing the other programmable circuit resources (e.g., subsystems) across the entirety of architecture 100. PMC 110 is capable of maintaining a safe and secure environment, booting architecture 100, and managing architecture 100 during normal operations. For example, PMC 110 is capable of providing unified and programmable control over power-up, boot/configuration, security, power management, safety monitoring, debugging, and/or error handling for the different subsystems of architecture 100 (e.g., DP array 102, PL 104, PS 106, NoC 108, and/or HCBs 112). PMC 110 operates as a dedicated platform manager that decouples PS 106 from PL 104. As such, PS 106 and PL 104 may be managed, configured, and/or powered on and/or off independently of one another.

HCBs 112 are special-purpose or application specific circuit blocks fabricated as part of architecture 100. Though hardwired, HCBs 112 may be configured by loading configuration data into control registers to implement one or more different modes of operation. Examples of HCBs 112 may include input/output (I/O) blocks (e.g., single-ended and pseudo differential I/Os), transceivers for sending and receiving signals to circuits and/or systems external to architecture 100 (e.g., high-speed differentially clocked transceivers), memory controllers, cryptographic engines, digital-to-analog converters (DACs), analog-to-digital converters (ADCs), and the like. In another aspect, one or more HCBs 112 may implement a RAM.

The various programmable circuit resources illustrated in FIG. 1 may be programmed initially as part of a boot process. During runtime, the programmable circuit resources may be reconfigured. In one aspect, PMC 110 is capable of initially configuring DP array 102, PL 104, PS 106, and NoC 108 to implement a user design. At any point during runtime, PMC 110 may reconfigure all or a portion of architecture 100. In some cases, PS 106 may configure and/or reconfigure PL 104 and/or NoC 108 once initially configured by PMC 110. In some examples, PMC 110 is omitted, in which case PS 106 may perform operations attributable to PMC 110.

Architecture 100 is provided as an example. Other example architectures for an IC may omit certain subsystems described herein and/or include additional subsystems not described herein. Further, the particular subsystems described herein may be implemented differently to have fewer or more components than shown.

Figure 2:
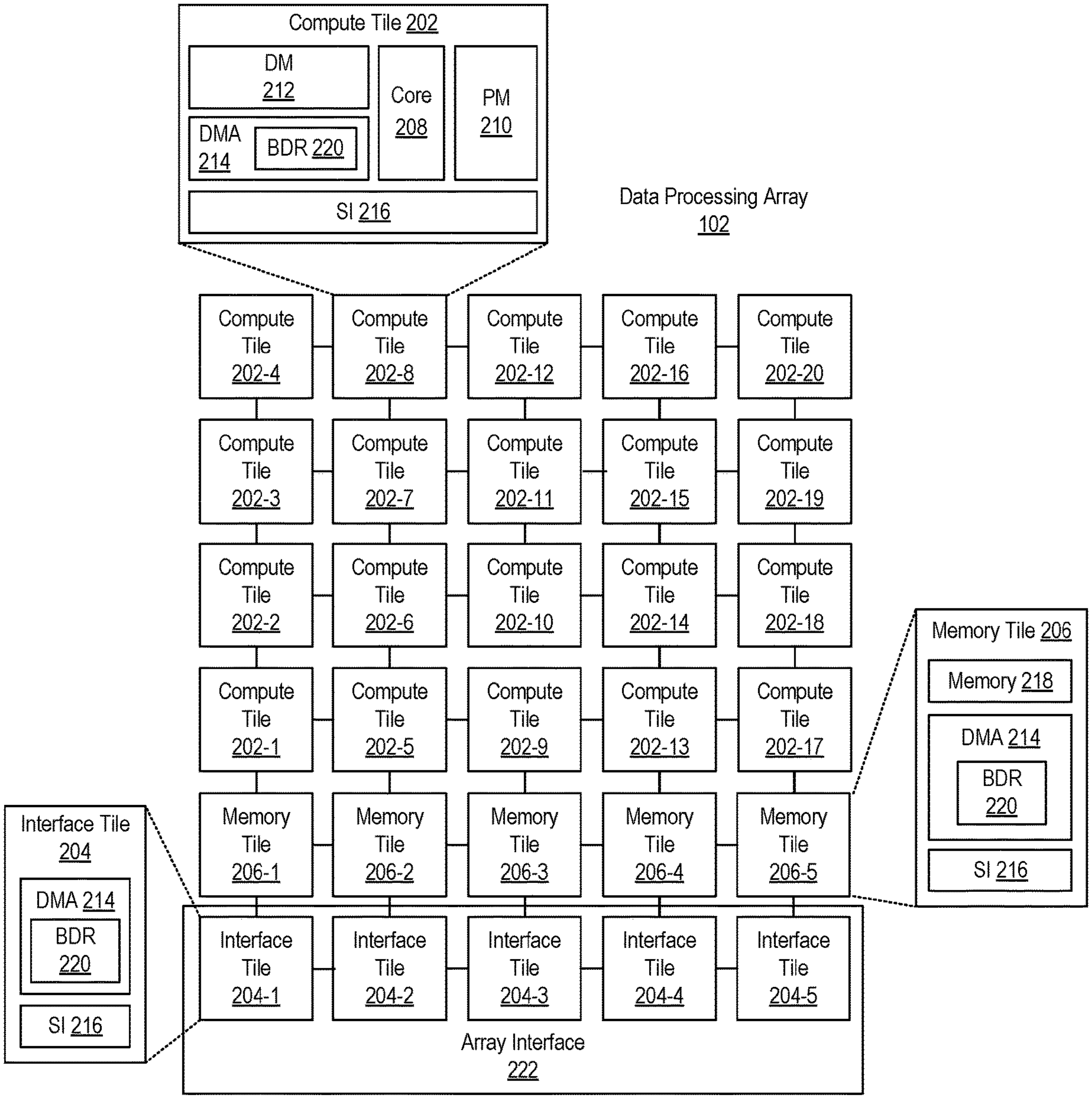
FIG. 2 illustrates an example implementation of a data processing (DP) array.

FIG. 2 illustrates an example implementation of DP array 102. DP array 102 may be implemented as a plurality of interconnected circuit blocks referred to as tiles. The interconnected tiles of data processing array 102 include compute tiles 202 and interface tiles 204. Data processing array 102 optionally includes one or more memory tiles 206. The tiles illustrated in FIG. 2 may be arranged in an array or grid and are hardwired.

Each compute tile 202 can include one or more cores 208, a program memory (PM) 210, a data memory (DM) 212, a DMA circuit 214, and a stream interconnect (SI) 216. In one aspect, each core 208 is capable of executing program code stored program memory 210. In one aspect, each core 208 may be implemented as a scalar processor, as a vector processor, or as a scalar processor and a vector processor operating in coordination with one another.

In one or more examples, each core 208 is capable of directly accessing the data memory 212 within the same compute tile 202 and the data memory 212 of any other compute tile 202 that is adjacent to the core 208 of the compute tile 202 in the up, down, left, and/or right directions. Core 208 sees data memories 212 within the same tile and in one or more other adjacent compute tiles as a unified region of memory (e.g., as a part of the local memory of the core 208). This facilitates data sharing among different compute tiles 202 in DP array 102. In other examples, core 208 may be directly connected to data memories 212 in other compute tiles 202.

Cores 208 may be directly connected with adjacent cores 208 via core-to-core cascade connections (not shown). In one aspect, core-to-core cascade connections are unidirectional and direct connections between cores 208. In another aspect, core-to-core cascade connections are bidirectional and direct connections between cores 208. In general, core-to-core cascade connections generally allow the results stored in an accumulation register of a source core 208 to be provided directly to an input of a target or load core 208 without traversing the stream interconnect 216 (e.g., without using DMA circuit 214) and/or being written by a first core 208 to data memory 212 to be read by a different core 208 (e.g., without using shared memory).

In an example implementation, compute tiles 202 do not include cache memories. By omitting cache memories, DP array 102 is capable of achieving predictable, e.g., deterministic, performance. Further, significant processing overhead is avoided since maintaining coherency among cache memories located in different compute tiles 202 is not required. In a further example, cores 208 do not have input interrupts. Thus, cores 208 are capable of operating uninterrupted. Omitting input interrupts to cores 208 also allows DP array 102 to achieve predictable, e.g., deterministic, performance.

In the example of FIG. 2, each compute tile 202 may be implemented substantially identically to include the same hardware components and/or circuitry. In other examples, compute tiles 202 may include different hardware components and/or circuitry. Further, DP array 102 may include an array of compute tiles formed of any of a variety of processing elements such as digital signal processing engines, cryptographic engines, Forward Error Correction (FEC) engines, or other specialized hardware for performing one or more specialized tasks.

DP array 102 may include one or more memory tiles 206. Memory tiles 206 include a memory 218 (e.g., a RAM), a DMA circuit 214, and a stream interconnect 216. Each memory tile 206 may read and/or write to the memory 218 of an adjacent memory tile 206 by way of the DMA circuit included in the memory tile 206. Further, each compute tile 202 in DP array 102 is capable of reading and writing to any one or more of memory tiles 206. In the example of FIG. 2, a compute tile 202 may not directly read and write a memory tile 206. The access occurs through a DMA circuit 214 in compute tile 202, a DMA circuit 214 in memory circuit block 206, and stream switch routing between the two DMA circuits. Memory tiles 206 are characterized by the lack of computational components such as processors (e.g., cores 208).

Interface tiles 204 form an array interface 222 for DP array 102. Array interface 222 operates as an interface that connects tiles of DP array 102 to other resources of the particular IC in which DP array 102 is disposed (e.g., PL 104, NoC 108, PS 106, and/or HCBs 112). In the example of FIG. 2, array interface 222 includes a plurality of interface tiles 204 organized in a row. Interface tiles 204 can include a stream interconnect 216 and a DMA circuit 214. Interface circuit blocks 204 are connected so that data may be propagated from one interface tile to another bi-directionally. Each interface tile 204 is capable of operating as an interface for the column of tiles directly above and is capable of interfacing such circuit blocks with components and/or subsystems of the IC including DP array 102. Each interface tile 204 is also capable of operating as an interface for tiles of DP array 102 in other columns.

In the example, each DMA circuit 214 includes a plurality of buffer descriptor registers (BDRs) 220. Each buffer descriptor register 220 is capable of storing one buffer descriptor. Each buffer descriptor specifies particular data transfer operations as part of a data access pattern to be implemented by a user design implemented in DP array 102. As the buffer descriptor registers 220 are circuit resources of each DMA circuit 214, the number of such registers in each DMA circuit is finite. As such, the efficient implementation of a user design and the data access pattern(s) for that user design means that the data access pattern is to be distilled into the fewest buffer descriptors possible so as to fit within the available buffer descriptor registers 220 of the respective DMA circuits 214 used to execute the user design.

In some examples, buffer descriptor registers 220 may be implemented the same from one type of tile to another. In other examples, buffer descriptor registers 220 may be implemented differently from one type of tile to another. For example, buffer descriptor registers 220 within DMA circuits disposed in compute tiles 202 may use 6 32-bit registers to store one buffer descriptor, while DMA circuits disposed in memory tiles 206 use 8 32-bit registers to store one buffer descriptor, and DMA circuits disposed in interface tiles 204 may use 6 32-bit registers to store one buffer descriptor.

In one or more examples, DMA circuits 214 may be multi-channel allowing the DMA circuit 214 to perform multiple data transfers in parallel (e.g., one per channel). In this regard, the available buffer descriptor registers 220 of a given DMA circuit 214 are shared among the different channels of the DMA circuit 214. Particular hardware rules also may dictate the sharing and/or allocation of buffer descriptor registers 220 between the channels of DMA circuits 214. This may further restrict the number of buffer descriptor registers 220 that may be used by DMA circuits 214.

Particular components common across different tiles of DP array 102 and having same reference numbers such as streaming interconnects 216, DMA circuits 214, and the like have substantially the same functionality from one tile to another. It should be appreciated, however, that the particular implementation of such tiles may differ from one type of tile to another. As an illustrative and non-limiting example, the number of ports of the streaming interconnects 216 may be different for a compute tile 202 compared to a memory tile 206 and/or an interface tile 222. Similarly, the number of channels of a DMA circuit 214 and/or the number of buffer descriptor registers 220 may be different in a compute tile 202 compared to a memory tile 206 and/or an interface tile 222. Differences in sizes and/or number of buffer descriptor registers 220 have been discussed already. Appreciably, in other examples, the various components may be implemented the same across different tiles.

The DP array 102 described herein is an example of a multi-compute circuit architecture. In other examples, the multi-compute circuit architecture may include a tiled circuit architecture having any of a variety of different compute circuits (e.g., cores whether configured to execute program code or hardened) to which multi-dimensional data may be distributed using a plurality of multi-dimensional data mover circuits.

It should be appreciated that the inventive arrangements described herein may be used with any of a variety of circuit architectures that utilize data mover circuits and configuration data for such circuits. As another example, the inventive arrangements may be used with so called Coarse Grain Reconfigurable Architecture (CGRA) type compute circuits. CGRAs are characterized by the inclusion of a large number of functional units (e.g., functional circuits) interconnected using a networking technology such as mesh. In some cases, the functional units perform various operations such as multiplication, addition, and/or subtraction. In some cases, CGRAs are implemented as an array of tiles (circuit blocks), where the tiles include processing elements and memories. As their name suggests, CGRAs are reconfigurable. In general, CGRAs operate on coarser granularity than other reconfigurable architectures such as Field Programmable Gate Arrays (FPGAs).

Each of the buffer descriptor registers 220 has a defined length (e.g., number of bits) and is formed of a plurality of fields. Each field also has a set length (e.g., number of bits). Table 1 is an example listing of fields of a buffer descriptor register 220.

TABLE 1

| |
|---|
| Base__Address: base address to the multi-dimensional data in contiguous memory space. |
| Buffer__Length: the total transfer length for one iteration of the buffer descriptor. |
| D0__Stepsize, D1__Stepsize, . . . , D[N-1]__Stepsize: the step size for each step in the respective dimension as described in the address generation technique illustrated in Listing 1 below. |
| D0__Wrap, D1__Wrap, . . . , D[N-2]__Wrap: the loop count for each dimension as described in the address generation technique of Listing 1. |
| D0__Zero__Before, D1__Zero__Before, . . . , D[N-2]__Zero__Before: the amount of padding before the respective dimension. |
| D0__Zero__After, D1__Zero__After, . . . , D[N-2]__Zero__After: the amount of padding after the respective dimension. |
| Iteration__Stepsize, Iteration__Wrap, Iteration__Current: iteration parameters specify how additional offset can be applied to the base address after each iteration of a buffer descriptor. |

It should be appreciated that the buffer descriptor registers 220 may include additional fields not included in the example of Table 1.

Listing 1 below illustrates an example address generation technique that may be used to generate addresses for accessing data using the fields described above. The address generation technique of Listing 1 utilizes stepsize and wrap fields of the buffer descriptor register. Further, for purposes of illustration, the value of N may be set to 4.

Listing 1

```
for D3 in range [0, int(buffer__length/(D0__Wrap*D1__Wrap*D2__Wrap)) )
  for D2 in range [0, D2__Wrap)
    for D1 in range [0, D1__Wrap)
      for D0 in range [0, D0__Wrap)
        address = Base__Address + D0__StepSize * D0 + D1__StepSize *
          D1 + D2__StepSize * D2 + D3__StepSize * D3
        count = count + 1
        if count == Buffer__Length
            end
```

The example of Listing 1 uses the dimension D0 as the inner-most dimension where data access is via contiguous memory. If the D0 wrap is set to 8 with a step size of 1, the inner most loop will iterate from 0, 1, . . . , to 7—e.g., 8 step sizes. As the inner loop iterates, the outer loops increment causing address generation for traversing the multi-dimensional tensor.

For additional iterations of a buffer descriptor, Table 2 illustrates an example technique for adding an additional offset to the base address on a per iteration basis.

Listing 2

```
Iteration__Current += 1 after each iteration
If Iteration__Current == Iteration__Wrap
  Iteration__Current = 0
base__address__offset = Iteration__Current * Iteration__Stepsize
address (computed from Listing 1) += base__address__offset
```

Figures 3, 4:
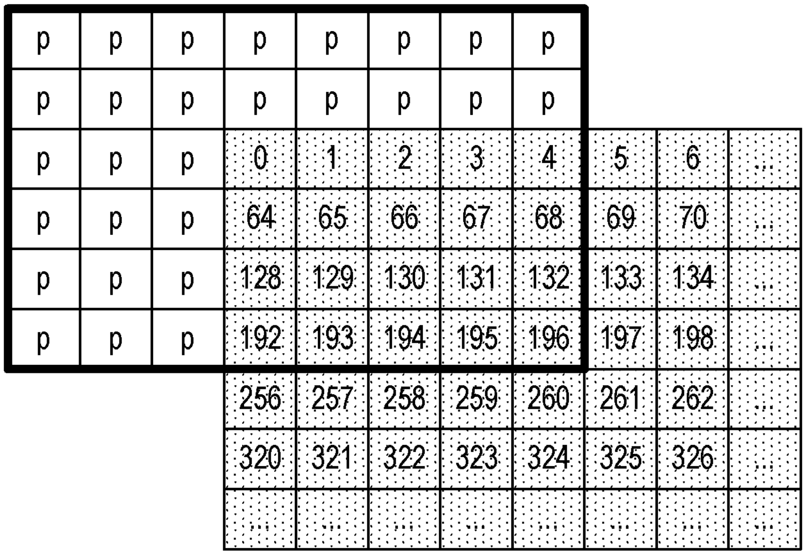
FIG. 3 illustrates an example of padding as applied to a 2-dimensional tensor.
FIG. 4 illustrates example values for step-size, wrap, and pad-before (zero before), and pad-after (zero after) of the respective fields of a buffer descriptor.

FIG. 3 illustrates an example of padding as applied to a 2-dimensional tensor. In the example, the letter "p" represents a padded value that is generated/returned in accordance with the zero before and zero after fields of the buffer descriptor.

FIG. 4 illustrates the values for step-size, wrap, and pad-before (zero before), and pad-after (zero after) values of the respective fields of the buffer descriptor for achieving the data traversal and padding of the multi-dimensional tensor illustrated in FIG. 3.

Referring to FIGS. 3 and 4, the parameters illustrated in FIG. 4 may result in addresses that produce the data stream: [{px8}, {px8}, p, p, p, 0, 1, . . . , 4, p, p, p, 64, . . . 68, p, p, p, 128, . . . , 132, p, p, p, 192, . . . , 196]. In the example, the wrap is 5 in dimension D0. Thus, there are 5 addresses generated in the D0 dimension before wrapping to a higher loop. The first 3 elements on the left are padded (e.g., pad-before=3). In the dimension D1, each time D1 is incremented, the dimension is incremented with a step size of 64.

Figure 5:
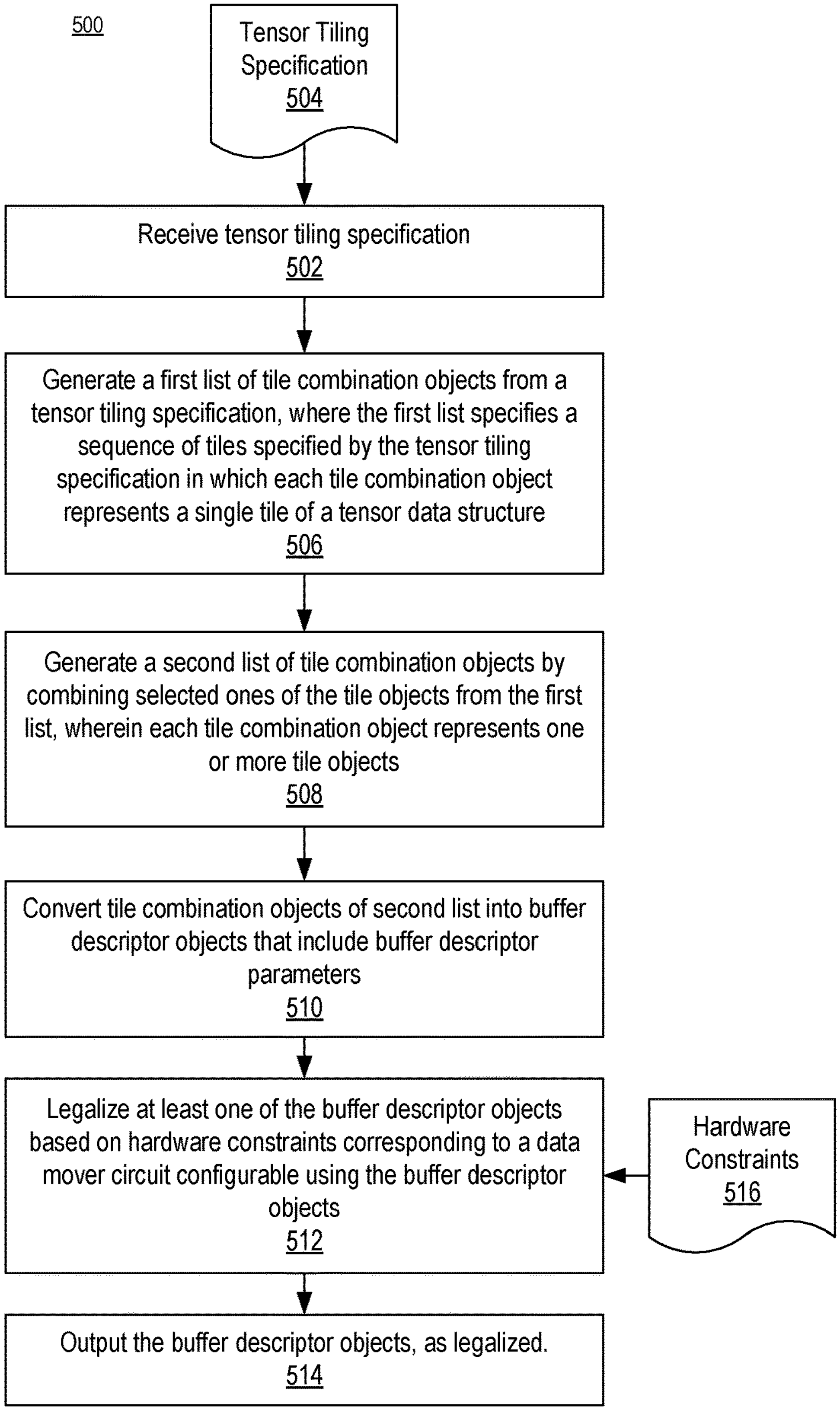
FIG. 5 illustrates an example method of generating configuration data for data mover circuits of a DP array.

FIG. 5 is an example method 500 of generating configuration data for data mover circuits. Method 500 may be used to generate configuration data for DMA circuits 214 of DP array 102. Method 500 may be implemented by a data processing system (system), e.g., a computer, executing program code that is configured to perform the operations described herein. An example of a data processing system that may be used to implement the operations of FIG. 5 is described in connection with FIG. 12.

Method 500 assumes that data for the user application is stored in memory from dimension $D_0$ to dimension $D_{N-1}$. Dimension $D_0$ is the inner-most dimension and is stored contiguously in memory. The system is capable of generating the buffer descriptors that may be written directly to buffer descriptor registers 220 of DMA circuits 214.

In block 502, the system receives a tensor tiling specification 504. The tensor tiling specification 504 may be specified by the user as a component or part of a user design to be executed by DP array 102. Tensor tiling specification 504 may be created in a high-level programming language (e.g., as source code) and specify the data access pattern to be used in executing the user design in DP array 102. In order to effectuate execution of the user design using the data access pattern, tensor tiling specification 504 must be compiled into actual configuration data, e.g., buffer descriptors, that may be loaded into buffer descriptor registers 220 of DMA circuits 214.

FIG. 6A illustrates an example Application Programming Interface (API) for specifying tensor tiling specification 504. FIG. 6A illustrates tile traversing parameters and tiling parameters in reference to tensors. For purposes of illustration and not limitation, the tiling traversal parameters of FIG. 6A are specified as a C++ struct. The tile traversing parameters, which begin at line 1, define how to traverse or access tiles of a tensor while the tiling parameters, which begin at line 15, define access patterns of a tensor. In one or more example implementations, tensor tiling specification 504 is specified, using the API of FIG. 6A as a tiling_parameters struct object that specifies tiles and tile traversal (e.g., a data access pattern).

FIG. 6B illustrates an example buffer descriptor that may be generated in accordance with the inventive arrangements described herein. For purposes of illustration and not limitation, the buffer descriptor illustrated in FIG. 6B is specified as a C++ struct.

Continuing with FIG. 5, in block 506, the system is capable of generating a first list of tile combination objects from tensor tiling specification 504. The first list of the tile combination objects specifies a sequence of tiles of a tensor specified by the tensor tiling specification. Each tile combination object of the first list represents a single tile of a tensor data structure. For example, given the tensor tiling specification 504 specified as a tiling_parameters struct object (also referred to as "tp"), the system is capable of iterating the inter-tile traversal from the inner-most nested loop tp.tile_traversal[0] to the outer-most nested traversing loop tp.tile_traversal[tp.tile_traversal.size( )−1]. In each traversing loop i, the tensor dimension of the traversal is tp.tile_traversal[i].dimension, the stride of the tile traversal in the dimension is tp.tile_traversal[i].stride, the loop steps are [0, 1, . . . , tp.tile_traversal[i].wrap−1]. Further detail regarding operation of block 506 is described in connection with FIG. 8.

FIG. 7 illustrates an example of a tile_combination struct object that may be used to represent tile(s) in the first list generated in block 506 and/or the second list generated in block 508.

In block 508, the system is capable of generating a second list of tile combination objects by combining selected tile combination objects from the first list. Each tile combination object of the second list represents one or more tile objects from the first list if such tile objects can be combined based on the rules described herein. In consequence, the second list is smaller than the first list in size given that a tile combination object of the second list (e.g., at least one of such objects) will represent two or more tile objects from the first list. In block 508, the system attempts to combine the tile_combination objects (also referenced by an index "it") it and it+1 based on particular rules. The rules, as applied by the system in implementing block 508, are described in greater detail in connection with FIG. 9.

In block 510, the system is capable of converting the tile combination objects of the second list into buffer descriptor objects that include buffer descriptor parameters. An example implementation of block 510 is provided in connection with FIGS. 11A and 11B hereinbelow.

In block 512, the system is capable of legalizing the buffer description objects (e.g., one or more or all as may be required) based on hardware constraints 516 corresponding to data mover circuit(s) that are configurable using the buffer descriptor objects, e.g., DMA circuits. For example, for each buffer descriptor object that is non-compliant with hardware constraints corresponding to a data mover circuit configurable using the buffer descriptor objects, the system legalizes that buffer descriptor object. Legalizing refers to modifying the buffer descriptor object to conform or comply with the hardware constraints. In block 512, the system ensures that all of the buffer descriptor objects are legalized. In block 512, the system is capable of checking each buffer descriptor parameters object against the hardware constraints 516 for the data mover circuit(s). In response to determining that any one or more or all of the buffer descriptor parameter objects does not comply with the hardware constraints, the system modifies that buffer descriptor parameters object to comply with the hardware constraints. For purposes of illustration, if hardware buffer descriptor registers operate on 32-bit-word step-size and the shared buffer object is in int32 or uint32 data type, in that case, no modifications need be performed on that buffer descriptor object.

For example, the system is capable of checking that each field of each of the buffer descriptors, as specified by the buffer descriptor objects, has the correct number of bits, e.g., that the data of the buffer descriptor does not exceed the maximum size or number of bits of the field as specified by hardware constraints 516 and/or that the number of dimensions is correct. Fields such as step size, wrap, zero padding, buffer length, and the like have size constraints specified by hardware constraints 516. In some cases, a tensor may be so large that these values exceed the hardware constraints. In such cases, the buffer descriptor is either split into two or more (e.g., multiple) buffer descriptors or other fields of buffer descriptors such as iteration parameters, additional dimension of wrap and step size may be used and/or adjusted.

In another example, the data types for certain values may be specified as integer, floating point, or the like. The hardware, e.g., a DMA circuit channel, may require that values be specified as a multiple of a particular word length (e.g., a 32-bit word) per the hardware constraints 516. The system, as part of block 512, may adjust certain values. If a dimension $D_0$ pertains to 8-bit data with a step size of 1 and 8 steps, the system may modify the buffer descriptor to use a granularity of 32 bits (based on hardware constraint 516) so that the step size is 1, where 32 bits of data are consumed, but the wrap size is changed to 2. The wrap is adjusted from 8 down to 2 as the 64 bits of data is divided into two 32-bit segments to comply with the hardware constraints of the DMA circuits. If there is an additional dimension that exceeds four, iteration may be used to represent a $5^{th}$ dimension.

In another example, the buffer descriptor length may be used instead of the wrap for the following conditions since the buffer descriptor length has more bits available than the wrap.

Condition 1: if the buffer descriptor object is 1 dimensional and has no padding, then system may erase the wrap.

Condition 2: if the value of the last wrap is more than the hardware limit, the system may erase the last dimension of the wrap.

Condition 3: if the dimension in wrap is "1" more than the hardware limit, the system may erase the last dimension of the wrap.

In block 514, the system is capable of outputting the buffer descriptor objects, as legalized. In one or more example implementations, the system outputs a list of buffer_descriptor_parameters struct objects and maps the buffer_descriptor_parameters struct objects onto a list of buffer descriptor registers for the DMA circuits. In one or more other example implementations, the outputting of the buffer descriptor objects, as legalized, includes converting the buffer descriptor objects into binary data that may be directly loaded into the buffer descriptor registers of DMA circuits 214.

Figure 8:
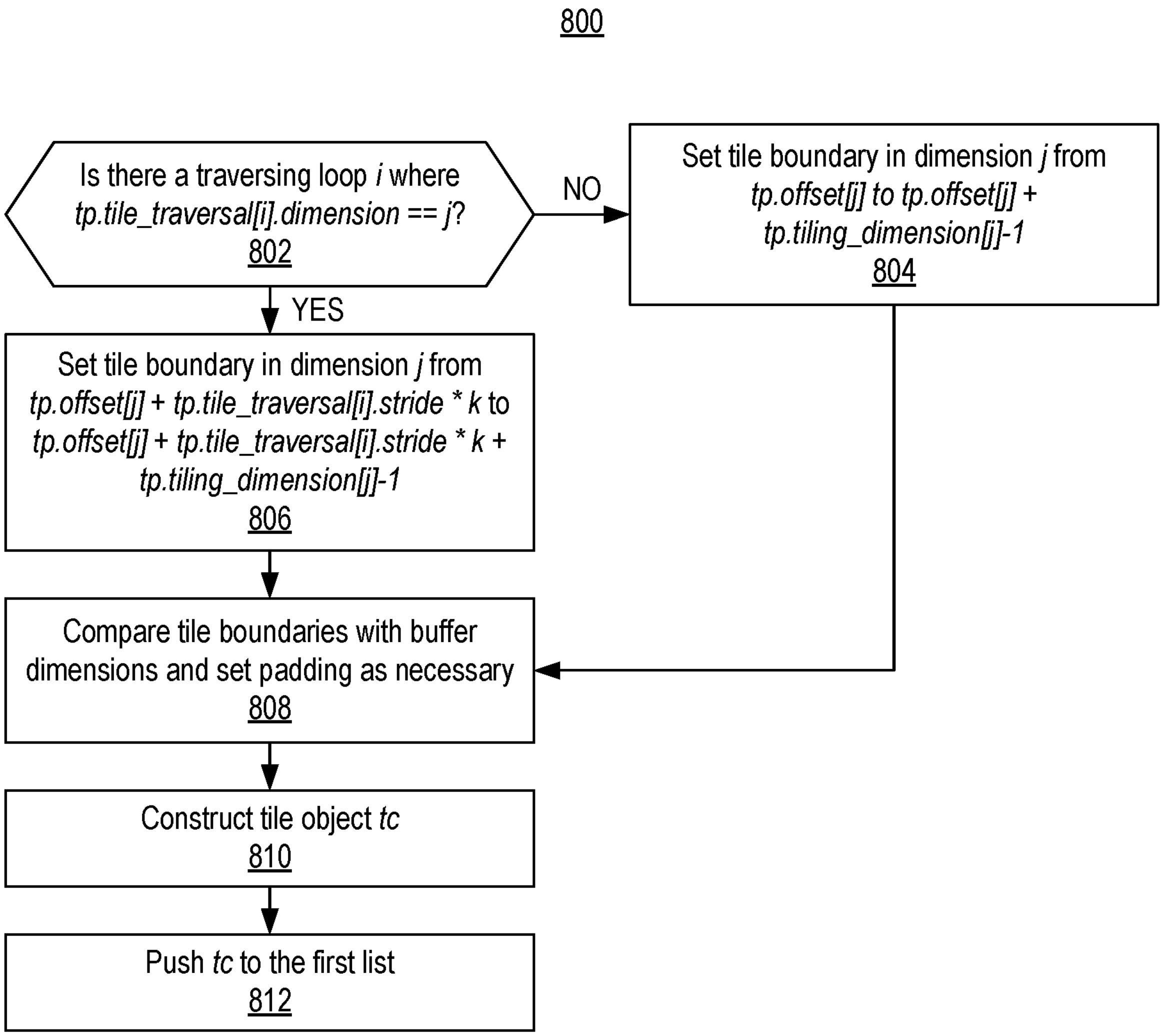
FIG. 8 is a method illustrating an example implementation of the inner loop portion performed as part of block 506 of FIG. 5.

FIG. 8 is a method 800 illustrating an example implementation of the inner loop portion performed as part of block 506 of FIG. 5. Method 800 illustrates an example technique for determining the boundary j for each traversing loop step. In block 802, the system determines whether there is a traversing loop i where the tile traversal dimension is equal to j (e.g., tp.tile_traversal[i].dimension==j). In response to determining that tp.tile_traversal[i].dimension does not equal j, the method continues to block 804. In response to determining that tp.tile_traversal[i].dimension does equal j, the method continues to block 806.

Referring to blocks 804 and 806, the loop step in loop i is k. In block 804, the tile boundary in dimension j is set from tp_offset[j] to tp_offset[j]+tp.tiling_dimension[j]−1. After block 804, the method continues to block 808. In block 806, the system sets the tile boundary in dimension j from tp.offset[j]+tp.tile_traversal[i].stride*k to tp.offset[j]+tp-.tile_ traversal[i].stride*k+tp.tiling_dimension[j]−1. In the example of FIG. 8, k refers to the offset difference. After block 806, the method continues to block 808.

In block 808, the system compares the tile boundaries with the buffer dimensions (tp.buffer_dimension) and sets the padding as necessary. For example, if the tile is outside of the buffer (e.g., outside of the tensor) in a certain dimension j, the system sets tc.padding[i].first and tc.padding[j].second based on the number of elements exceed before and after the buffer in dimension j.

In block 810, the system constructs the tile_combination struct object tc, where tc.tiling_dimension is the tile dimension within tp.buffer_dimension and tc.offset is the offset of the tile within tp.buffer_dimension.

In block 812, the system pushes the tile object tc onto the first list L1. The result generated from block 506 by iteratively performing method 800 as illustrated in FIG. 8 is a first list L1 of tile_combination objects struct objects. Each object tc in the first list L1 is placed in traversing order.

Listing 3 illustrates an example of tensor tiling specification 504 that is specified as a tiling_parameters struct object. As discussed, tiling specification 504 is processed by the system through block 506 to generate the first list L1.

Listing 3

```
{ .buffer_dimension = { 8, 64, 8, 52 }, .tiling_dimension = { 8, 20, 2, 16 }, .offset = { 0, –
1, 0, –1 }, .tile_traversal = { { .dimension = 2, .stride = 2, .wrap = 4 }, { .dimension = 3,
.stride = 14, .wrap = 4 } } }
```

Listing 4 illustrates an example of the first list L1 as generated by the system as an output from block 506.

Listing 4

```
{ .tiling_dimension = { 8, 19, 2, 15 }, .offset = { 0, 0, 0, 0 }, .padding = { (0, 0), (1, 0), (0,
0), (1, 0) }, .tile_traversal = { } }
{ .tiling_dimension = { 8, 19, 2, 15 }, .offset = { 0, 0, 2, 0 }, .padding = { (0, 0), (1, 0), (0,
0), (1, 0) }, .tile_traversal = { } }
{ .tiling_dimension = { 8, 19, 2, 15 }, .offset = { 0, 0, 4, 0 }, .padding = { (0, 0), (1, 0), (0,
0)   , (1, 0) }, .tile_traversal = { } }
...
{ .tiling_dimension = { 8, 19, 2, 11 }, .offset = { 0, 0, 0, 41 }, .padding = { (0, 0), (1, 0),
(0, 0), (0, 5) }, .tile_traversal = { } }
{ .tiling_dimension = { 8, 19, 2, 11 }, .offset = { 0, 0, 2, 41 }, .padding = { (0, 0), (1, 0),
(0, 0), (0, 5) }, .tile_traversal = { } }
{ .tiling_dimension = { 8, 19, 2, 11 }, .offset = { 0, 0, 4, 41 }, .padding = { (0, 0), (1, 0),
(0, 0), (0, 5) }, .tile_traversal = { } }
{ .tiling_dimension = { 8, 19, 2, 11 }, .offset = { 0, 0, 6, 41 }, .padding = { (0, 0), (1, 0),
(0, 0), (0, 5) }, .tile_traversal = { } }
```

In the examples of Listing 3 and Listing 4, the first list L1 contains tile_combination struct objects, e.g., 16 such objects.

Figure 9A:
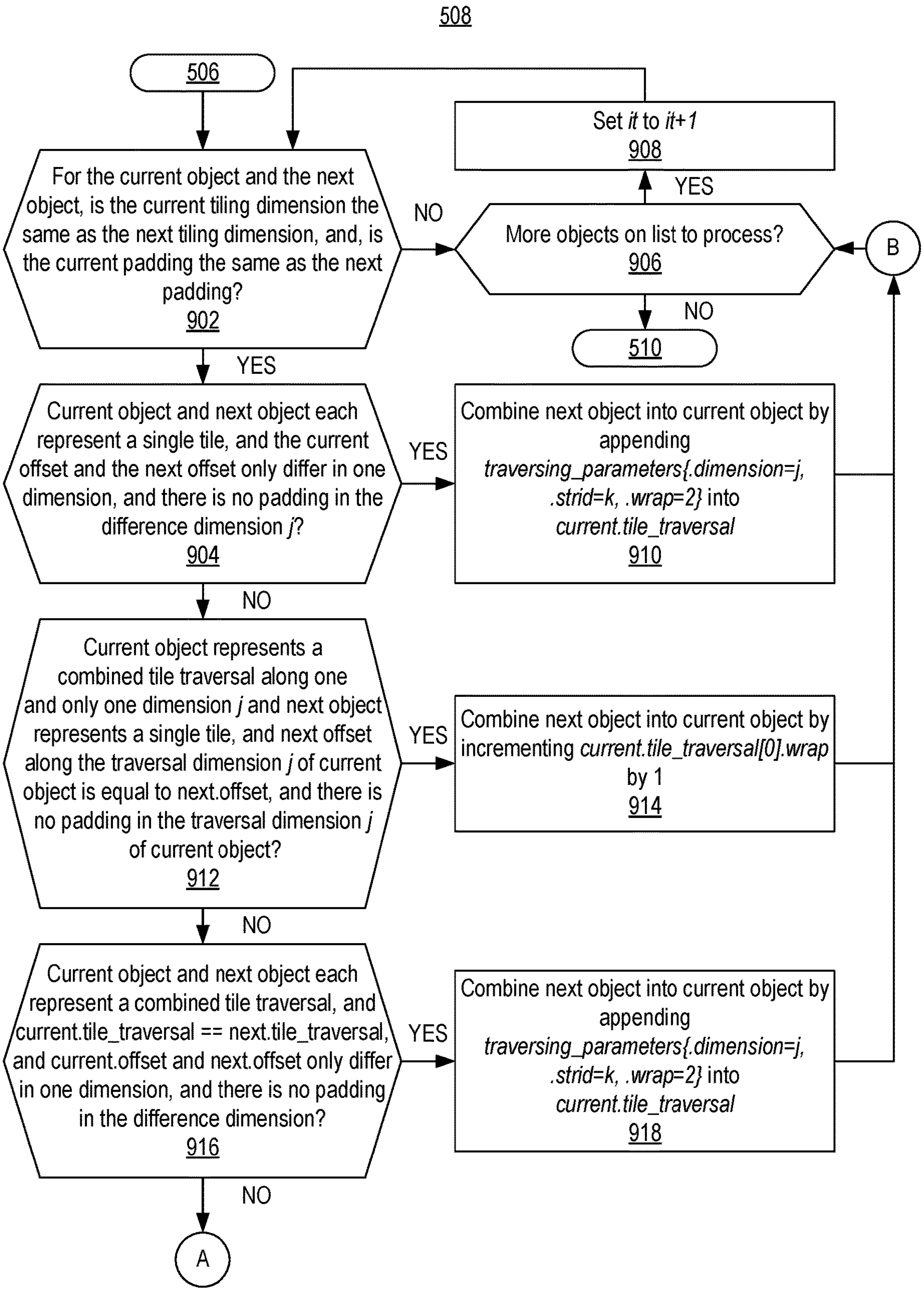
FIGS. 9A and 9B, taken collectively, illustrate an example method of performing block 508 of FIG. 5.
Figure 9B:
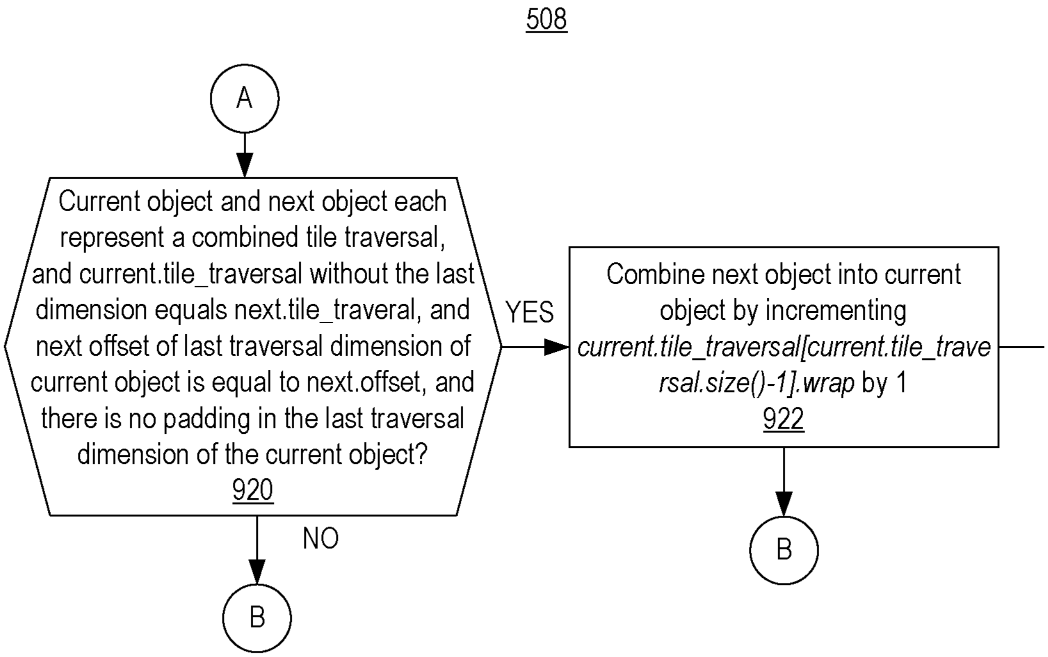

FIGS. 9A and 9B, taken collectively and collectively referred to herein as "FIG. 9," illustrate an example method of performing block 508 of FIG. 5. In general, the system determines whether tile combination (tc) objects it and it+1 from the first list L1 can be combined, e.g., are adjacent. For purposes of illustration "it" means an "iterator" that is pointing to a current object and the current tile_combination object is referred to as the tile_combination object (or object) at it, while the next tile_combination object is referred to as the next tile_combination object (or next object) at it+1.

In block 902, with respect to the current object and the next object, the system determines whether the current.tiling_dimension==next.tiling_dimension and the current.padding==next.padding. In response to determining that the current object and the next object meet the criteria of block 902, the method continues to block 904. In response to determining that the current object and the next object do not meet the criteria of block 902, the method continues to block 906.

In block 906, the system determines whether there are more objects from the first list L1 to process. In response to determining that more objects remain to be processed, the method proceeds to block 908 where the current object it is set to it+1. In block 908, iterator it is updated to point to the next object, e.g., it+1. In response to determining that no further objects remain to be processed, the method of block 508 ends and the overall procedure continues to block 510 of FIG. 5.

In general, the system is able to combine two consecutive objects, e.g., the current tile_combination object (it) and the next tile_combination object (it+1) if the condition in block 902 is met and at least one of the conditions defined in block 904, 912, 916, or 920 is also met.

In block 904, the system determines whether the current object and the next object each represent a single tile, the current offset and the next offset only differ in one dimension, and there is no padding in the difference dimension j. In block 904, j is the difference dimension and k is the offset difference. The condition of the current object and next object both representing a single tile may be specified as tile_traversal.empty( )==true.

In response to determining that the conditions in block 904 are met, the method continues to block 910 where the next object is combined into the current object. In block 910, the system combines the current object and the next object by appending traversing_parameters{.dimension=j, .stride=k, .wrap=2} into current.tile_traversal. After block 910, the method continues to block 906.

In response to determining that the conditions in block 904 are not met, the method continues to block 912. In block 912, the system determines whether the current object represents a combined tile traversal (e.g., tiles that have already been combined) along one and only one dimension j and the next object represents a single tile, the next offset along the traversal dimension j of the current object is equal to next.offset, and there is no padding in the traversal dimension j of the current object.

In response to determining that the conditions in block 912 are met, the method continues to block 914 where the next object is combined into the current object. In block 914, the system combines the next object into the current object by incrementing current.tile_traversal[0].wrap by 1. After block 914, the method continues to block 906.

In response to determining that the conditions in block 912 are not met, the method continues to block 916. In block 916, the system determines whether the current object and the next object each represent a combined tile traversal, the current.tile_traversal==next.tile_traversal, the current.offset and the next.offset only differ in one dimension, and there is no padding in the difference dimension. In this example, j is the difference dimension and k is the offset difference.

In response to determining that the conditions in block 916 are met, the method continues to block 918 where the next object is combined into the current object. In block 918, the system combines the next object into the current object by appending traversing_parameters{.dimension=j, .stride=k, .wrap=2} into current.tile_traversal. After block 918, the method continues to block 906.

In response to determining that the conditions in block 916 are not met, the method continues to block 920. In block 920, the system determines whether the current object and the next object each represent a combined tile traversal, current.tile_traversal without (e.g., excluding) the last dimension is equal to next.tile_traversal, the next offset of the last traversal dimension of the current object is equal to the next.offset, and there is no padding in the last traversal dimension of the current object.

In response to determining that the conditions in block 920 are met, the method continues to block 922 where the next object is combined into the current object. In block 922, the system combines the next object into the current object by incrementing current.tile_traversal[current.tile_traversal-.size( )−1].wrap by 1. After block 922, the method continues to block 906.

In response to determining that the conditions in block 920 are not met, the current object and the next object are not combined and the method loops back to block 906. In block 906, in response to the system determining that there are no further objects to process, the method of block 508 ends and the overall procedure continues to block 510 of FIG. 5.

Figure 10:
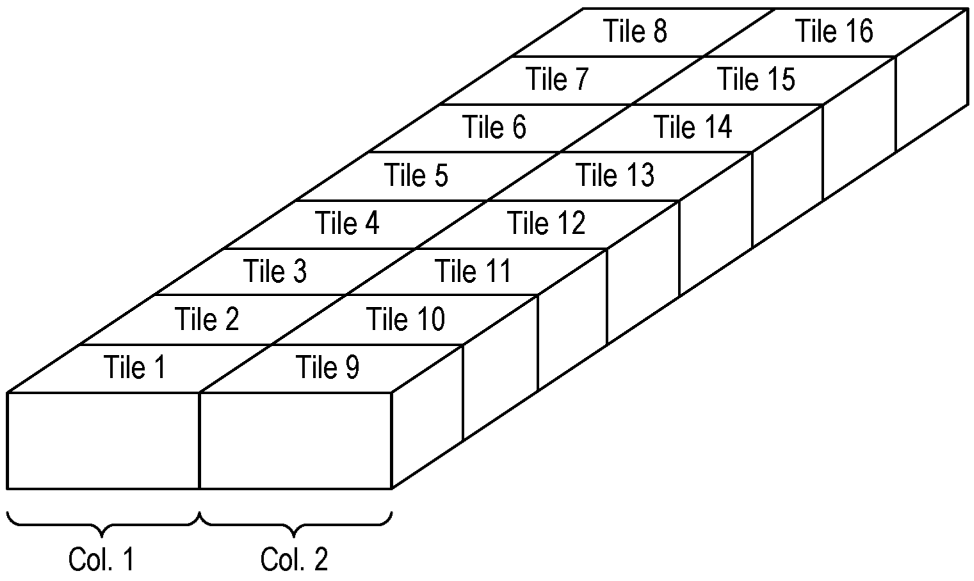
FIG. 10 illustrates an example tensor in which tiles of the tensor may be combined and represented using a single buffer descriptor.

FIG. 10 illustrates an example where tiles of a tensor may be combined and represented using a single buffer descriptor. In the example, tiles of the tensor illustrated in FIG. 10 may be navigated from tile 1, to tile 2, through tile 8 of column 1, then tile 9, to tile 10, through tile 16 of column 2. Each tile would require a different buffer descriptor (e.g., 16 buffer descriptors) to implement the data access pattern. With 16 buffer descriptors, the step size is equal to 1 and the wrap is 8.

If, for example, tiles 1-2 are combined, tiles 3-4 are combined, tiles 5-6 are combined, tiles 7-8 are combined, tiles 9-10 are combined, tiles 11-12 are combined, tiles 13-14 are combined, and tiles 15-16 are combined, each combined tile may be represented by a single buffer descriptor reducing the number of buffer descriptors and buffer descriptor registers needed to 8. In that case, the step size becomes 2 and the wrap becomes 4. If the tensor includes additional rows, each row may correspond to a different DMA circuit or a different channel of a DMA circuit.

Listing 5 illustrates an example of the second list L2 as generated by the system as an output from block 508.

Listing 5

```
{ .tiling_dimension = { 8, 19, 2, 15 }, .offset = { 0, 0, 0, 0 }, .padding = {(0, 0), (1, 0), (0,
0), (1, 0)}, .tile_traversal = { (2, 2, 4) } }
{ .tiling_dimension = { 8, 19, 2, 16 }, .offset = { 0, 0, 0, 13 }, .padding = {(0, 0), (1, 0), (0,
```

-continued

Listing 5

```
0), (0, 0)}, .tile__traversal = { (2, 2, 4), (3, 14, 2) } }
{ .tiling__dimension = { 8, 19, 2, 11 }, .offset = { 0, 0, 0, 41 }, .padding = {(0, 0), (1, 0), (0,
0), (0, 5)}, .tile__traversal = { (2, 2, 4) } }
```

FIGS. 11A and 11B, taken collectively, illustrate an example pseudo code implementation of block 510 of FIG. 5. In general, block 510 aims to combine dimensions while converting tile_combination objects into buffer_descriptor_ parameters objects. FIGS. 11A and 11B illustrate an example technique for converting each tile_combination object (tc) in the second list L2 to a buffer_descriptor_parameters object (bd). In the example, N is defined as the tc.tiling_dimension.size( ). The result of block 510 is a list of buffer_descriptor_parameter objects derived from, e.g., translated from, corresponding tile_combination objects.

Listing 6 illustrates an example list of buffer_descriptor_ parameter objects as generated by block 510. In the example of Listing 6, the element data type is 8-bit (1-byte) integer. Listing 6 also illustrative of condition 2 described above in connection with legalization of block 512. In the example of Listing 6, dimension 0 and 1 from Listing 5 have been combined.

Listing 6

```
{
  length: 20480
  offset: 0
  stepsize: 1, 512, 4096, 1024
  wrap: 152, 2, 15, 4
  padding: (8, 0) (0, 0) (1, 0)
  iteration__stepsize: 0
  iteration__wrap: 0
  packet__port__id: -1
}
{
  length: 20480
  offset: 53248
  stepsize: 1, 512, 4096, 1024
  wrap: 152, 2, 16, 4
  padding: (8, 0) (0, 0) (0, 0)
  iteration__stepsize: 57344
  iteration__wrap: 2
  packet__port__id: -1
}
{
  length: 20480
  offset: 167936
  stepsize: 1, 512, 4096, 1024
  wrap: 152, 2, 11, 4
  padding: (8, 0) (0, 0) (0, 5)
  iteration__stepsize: 0
  iteration__wrap: 0
  packet__port__id: -1
}
```

Listing 7 illustrates an example list of buffer descriptor parameters as generated post legalization performed in block 512. The list of buffer descriptor parameters are 32-bit word aligned buffer descriptor variables in units of 32-bit words based on an example implementation of DMA circuits 214.

Listing 7

```
{
  length: 5120
```

-continued

Listing 7

```
  offset: 0
  stepsize: 1, 128, 1024, 256
  wrap: 38, 2, 15, 4
  padding: (2, 0) (0, 0) (1, 0)
  iteration__stepsize: 0
  iteration__wrap: 0
  packet__port__id: -1
}
{
  length: 5120
  offset: 13312
  stepsize: 1, 128, 1024, 256
  wrap: 38, 2, 16, 4
  padding: (2, 0) (0, 0) (0, 0)
  iteration__stepsize: 14336
  iteration__wrap: 2
  packet__port__id: -1
}
{
  length: 5120
  offset: 41984
  stepsize: 1, 128, 1024, 256
  wrap: 38, 2, 11, 4
  padding: (2, 0) (0, 0) (0, 5)
  iteration__stepsize: 0
  iteration__wrap: 0
  packet__port__id: -1
}
```

Figure 12:
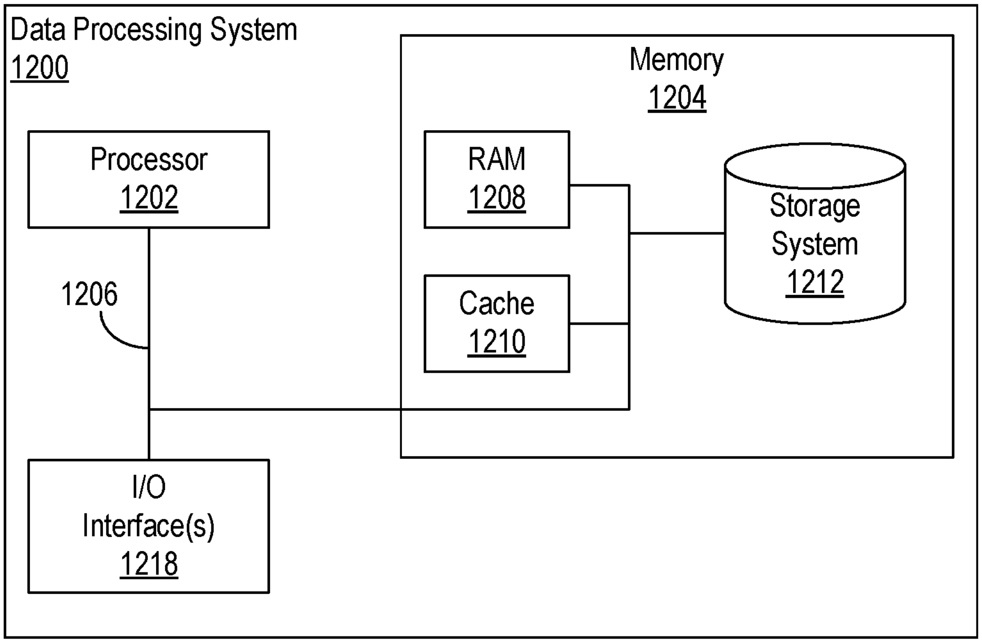
FIG. 12 illustrates an example implementation of a data processing system.

FIG. 12 illustrates an example implementation of a data processing system 1200. As defined herein, the term "data processing system" means one or more hardware systems configured to process data, each hardware system including at least one processor and memory, wherein the processor is programmed with computer-readable instructions that, upon execution, initiate operations. Data processing system 1200 can include a processor 1202, a memory 1204, and a bus 1206 that couples various system components including memory 1204 to processor 1202.

Processor 1202 may be implemented as one or more processors. In an example, processor 1202 is implemented as a central processing unit (CPU). Processor 1202 may be implemented as one or more circuits capable of carrying out instructions contained in program code. The circuit may be an integrated circuit or embedded in an integrated circuit. Processor 1202 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 1206 represents one or more of any of a variety of communication bus structures. By way of example, and not limitation, bus 1206 may be implemented as a Peripheral Component Interconnect Express (PCIe) bus. Data processing system 1200 typically includes a variety of computer system readable media. Such media may include computer-readable volatile and non-volatile media and computer-readable removable and non-removable media.

Memory 1204 can include computer-readable media in the form of volatile memory, such as random-access memory (RAM) 1208 and/or cache memory 1210. Data processing system 1200 also can include other removable/non-removable, volatile/non-volatile computer storage media. By way of example, storage system 1212 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1106 by one or more data media interfaces. Memory 1204 is an example of at least one computer program product.

Memory 1204 is capable of storing computer-readable program instructions that are executable by processor 1202. For example, the computer-readable program instructions can include an operating system, one or more application programs, other program code, and program data. For example, the computer-readable program instructions may implement an Electronic Design Automation (EDA) system and/or a compiler that is capable of performing the operations described herein. The computer-readable program code also may be capable of performing an implementation flow on a user design or portion thereof. The implementation flow may include synthesis, placement, routing, and/or any other compilation operations for implementing a user design in an IC having an architecture corresponding to that of FIG. 1 or one similar thereto. In this regard, data processing system 1200 serves as an example of one or more EDA tools or a system that is capable of processing circuit and/or user designs through a design flow.

Processor 1202, in executing the computer-readable program instructions, is capable of performing the various operations described herein that are attributable to a computer. It should be appreciated that data items used, generated, and/or operated upon by data processing system 1200 are functional data structures that impart functionality when employed by data processing system 1200. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 1200 may include one or more Input/Output (I/O) interfaces 1218 communicatively linked to bus 1206. I/O interface(s) 1218 allow data processing system 1200 to communicate with one or more external devices and/or communicate over one or more networks such as a local area network (LAN), a wide area network (WAN), and/or a public network (e.g., the Internet). Examples of I/O interfaces 1218 may include, but are not limited to, network cards, modems, network adapters, hardware controllers, etc. Examples of external devices also may include devices that allow a user to interact with data processing system 1200 (e.g., a display, a keyboard, and/or a pointing device) and/or other devices such as accelerator card.

Data processing system 1200 is only one example implementation. Data processing system 1200 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

The example of FIG. 12 is not intended to suggest any limitation as to the scope of use or functionality of example implementations described herein. Data processing system 1200 is an example of computer hardware that is capable of performing the various operations described within this disclosure. In this regard, data processing system 1200 may include fewer components than shown or additional components not illustrated in FIG. 12 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, "data processing system" means one or more hardware systems configured to process data, each hardware system including at least one hardware processor programmed to initiate operations and memory.

As defined herein, "execute" and "run" comprise a series of actions or events performed by the hardware processor in accordance with one or more machine-readable instructions. "Running" and "executing," as defined herein refer to the active performing of actions or events by the hardware processor. The terms run, running, execute, and executing are used synonymously herein.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "individual" and "user" each refer to a human being.

As defined herein, the term "hardware processor" means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "output" means storing in physical memory elements, e.g., devices, writing to display or other peripheral output device, sending or transmitting to another system, exporting, or the like.

As defined herein, the term "real-time" means a level of processing responsiveness that a user or system senses as sufficiently immediate for a particular process or determination to be made, or that enables the processor to keep up with some external process.

As defined herein, the term "soft" in reference to a circuit means that the circuit is implemented in programmable logic or programmable circuitry. Thus, a "soft processor" means at least one circuit implemented in programmable circuitry that is capable of carrying out instructions embodied as program instructions.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

generating a first list of tile combination objects from a tensor tiling specification, wherein the first list specifies a sequence of tiles specified by the tensor tiling specification in which each tile combination object of the first list represents a single tile of a tensor data structure;

generating a second list of tile combination objects by combining selected tile combination objects from the first list, wherein each tile combination object of the second list represents one or more tiles;

converting the tile combination objects of the second list into buffer descriptor objects comprising buffer descriptor parameters;

legalizing each of the buffer descriptor objects that is non-compliant with hardware constraints corresponding to a data mover circuit configurable using the buffer descriptor objects; and outputting the buffer descriptor objects, as legalized.

2. The method of claim 1, wherein the tensor tiling specification specifies a data access pattern, implemented by a user design, for the tensor data structure.

3. The method of claim 2, wherein the user design is executable by a multi-circuit hardware architecture.

4. The method of claim 3, wherein the multi-circuit hardware architecture includes a data processing array having a plurality of tiles.

5. The method of claim 1, wherein the generating the first list of the tile combination objects comprises:

determining tiles of the tensor data structure from the tensor tiling specification.

6. The method of claim 5, further comprising:

traversing the tensor tiling specification to determine a traversal order of the tiles of the tensor data structure for a user design, wherein the first list is specified in the traversal order.

7. The method of claim 1, wherein the legalizing comprises splitting at least one of the buffer descriptor objects into a plurality of buffer descriptor objects based on hardware constraints.

8. A system, comprising:

one or more hardware processors configured to initiate operations including:

generating a first list of tile combination objects from a tensor tiling specification, wherein the first list specifies a sequence of tiles specified by the tensor tiling specification in which each tile combination object of the first list represents a single tile of a tensor data structure;

generating a second list of tile combination objects by combining selected tile combination objects from the first list, wherein each tile combination object of the second list represents one or more tiles;

converting the tile combination objects of the second list into buffer descriptor objects comprising buffer descriptor parameters;

legalizing each of the buffer descriptor objects that is non-compliant with hardware constraints corresponding to a data mover circuit configurable using the buffer descriptor objects; and outputting the buffer descriptor objects, as legalized.

9. The system of claim 8, wherein the tensor tiling specification specifies a data access pattern, implemented by a user design, for the tensor data structure.

10. The system of claim 9, wherein the user design is executable by a multi-circuit hardware architecture.

11. The system of claim 10, wherein the multi-circuit hardware architecture includes a data processing array having a plurality of tiles.

12. The system of claim 8, wherein the generating the first list of the tile combination objects comprises:

determining tiles of the tensor data structure from the tensor tiling specification.

13. The system of claim 12, wherein the one or more hardware processors are configured to initiate operations further comprising:

traversing the tensor tiling specification to determine a traversal order of the tiles of the tensor data structure for a user design, wherein the first list is specified in the traversal order.

14. The system of claim 8, wherein the legalizing comprises splitting at least one of the buffer descriptor objects into a plurality of buffer descriptor objects based on hardware constraints.

15. A computer program product comprising one or more computer readable storage mediums having program instructions embodied therewith, wherein the program instructions are executable by computer hardware to cause the computer hardware to initiate executable operations comprising:

generating a first list of tile combination objects from a tensor tiling specification, wherein the first list specifies a sequence of tiles specified by the tensor tiling specification in which each tile combination object of the first list represents a single tile of a tensor data structure;

generating a second list of tile combination objects by combining selected ones of the tile combination objects from the first list, wherein each tile combination object of the second list represents one or more tiles;

converting the tile combination objects of the second list into buffer descriptor objects comprising buffer descriptor parameters;

legalizing each of the buffer descriptor objects that is non-compliant with hardware constraints corresponding to a data mover circuit configurable using the buffer descriptor objects; and outputting the buffer descriptor objects, as legalized.

16. The computer program product of claim 15, wherein the tensor tiling specification specifies a data access pattern, implemented by a user design, for the tensor data structure.

17. The computer program product of claim 16, wherein the user design is executable by a multi-circuit hardware architecture.

18. The computer program product of claim 17, wherein the multi-circuit hardware architecture includes a data processing array having a plurality of tiles.

19. The computer program product of claim 15, wherein the generating the first list of the tile combination objects comprises:

determining tiles of the tensor data structure from the tensor tiling specification; and traversing the tensor tiling specification to determine a traversal order of the tiles of the tensor data structure for a user design, wherein the first list is specified in the traversal order.

20. The computer program product of claim 15, wherein the legalizing the buffer descriptor objects comprises splitting at least one of the buffer descriptor objects into a plurality of buffer descriptor objects based on hardware constraints.

* * * * *